(12) United States Patent
Koehler et al.

(10) Patent No.: US 7,714,983 B2
(45) Date of Patent: May 11, 2010

(54) ILLUMINATION SYSTEM FOR A MICROLITHOGRAPHY PROJECTION EXPOSURE INSTALLATION

(75) Inventors: Jess Koehler, Immenstaad (DE); Johannes Wangler, Koenigsbronn (DE); Markus Brotsack, Aalen (DE); Wolfgang Singer, Aalen (DE); Damian Fiolka, Oberkochen (DE); Manfred Maul, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 759 days.

(21) Appl. No.: 10/571,475

(22) PCT Filed: Sep. 13, 2004

(86) PCT No.: PCT/EP2004/010188

§ 371 (c)(1),
(2), (4) Date: Feb. 12, 2007

(87) PCT Pub. No.: WO2005/026843

PCT Pub. Date: Mar. 24, 2005

(65) Prior Publication Data

US 2007/0165202 A1    Jul. 19, 2007

(30) Foreign Application Priority Data

Sep. 12, 2003 (DE) ............................... 103 433 33
Feb. 26, 2004 (DE) ....................... 10 2004 010 571

(51) Int. Cl.
*G03B 27/54* (2006.01)
*G03B 27/72* (2006.01)
*G03B 27/42* (2006.01)

(52) U.S. Cl. ............................. 355/67; 355/71; 355/53

(58) Field of Classification Search ............. 355/67–72, 355/52, 53, 55, 77; 359/15, 19, 20, 619, 359/569, 575; 250/492.1, 492.2, 492.22, 250/548

See application file for complete search history.

(56) References Cited

U.S. PATENT DOCUMENTS 5,305,054 A    4/1994   Suzuki et al.

(Continued)

FOREIGN PATENT DOCUMENTS

DE           199 44 760 A1       3/2001

(Continued)

OTHER PUBLICATIONS

Norbert Streibl, "Beam Shaping With Optical Array Generators", Journal of Modern Optics, 1989, vol. 36, No. 12, pp. 1559-1573.

(Continued)

*Primary Examiner*—Peter B Kim
*Assistant Examiner*—Christina Riddle
(74) *Attorney, Agent, or Firm*—Sughrue Mion, PLLC

(57) ABSTRACT

An illumination system for a microlithography projection exposure installation is used to illuminate an illumination field with the light from a primary light source (11). The illumination system has a light distribution device (25) which receives light from the primary light source and, from this light, produces a two-dimensional intensity distribution which can be set variably in a pupil-shaping surface (31) of the illumination system. The light distribution device has at least one optical modulation device (20) having a two-dimensional array of individual elements (21) that can be controlled individually in order to change the angular distribution of the light incident on the optical modulation device. The device permits the variable setting of extremely different illuminating modes without replacing optical components.

35 Claims, 7 Drawing Sheets

U.S. PATENT DOCUMENTS

| | | | |
|---|---|---|---|
| 5,453,814 A * | 9/1995 | Aiyer | 355/70 |
| 5,523,193 A | 6/1996 | Nelson | |
| 5,574,537 A * | 11/1996 | Ozawa | 355/71 |
| 5,638,211 A | 6/1997 | Shiraishi | |
| 5,691,541 A | 11/1997 | Ceglio et al. | |
| 5,850,310 A | 12/1998 | Schweizer | |
| 6,055,106 A * | 4/2000 | Grier et al. | 359/566 |
| 6,060,224 A | 5/2000 | Sweatt et al. | |
| 6,211,944 B1 | 4/2001 | Shiraishi | |
| 6,252,647 B1 | 6/2001 | Shiraishi | |
| 6,281,993 B1 * | 8/2001 | Bernal et al. | 359/29 |
| 6,285,443 B1 | 9/2001 | Wangler et al. | |
| 6,285,488 B1 * | 9/2001 | Sandstrom | 359/290 |
| 6,295,122 B1 * | 9/2001 | Schultz et al. | 355/67 |
| 6,428,940 B1 | 8/2002 | Sandstrom | |
| 6,438,199 B1 * | 8/2002 | Schultz et al. | 378/34 |
| 6,469,827 B1 | 10/2002 | Sweatt et al. | |
| 2001/0001247 A1 | 5/2001 | Finders et al. | |
| 2002/0033936 A1 * | 3/2002 | Shiraishi | 355/53 |
| 2002/0060760 A1 * | 5/2002 | Weiner | 349/96 |
| 2002/0105629 A1 * | 8/2002 | Sandstrom et al. | 355/71 |
| 2002/0136351 A1 | 9/2002 | Singer | |
| 2003/0038225 A1 | 2/2003 | Mulder et al. | |
| 2003/0227606 A1 | 12/2003 | Sweatt | |
| 2004/0108467 A1 | 6/2004 | Eurlings et al. | |

FOREIGN PATENT DOCUMENTS

| | | |
|---|---|---|
| EP | 0 500 393 A2 | 8/1992 |
| EP | 0 747 772 A1 | 12/1996 |
| EP | 1 109 067 A2 | 6/2001 |
| EP | 1 262 836 A1 | 12/2002 |
| EP | 1 426 823 A1 | 6/2004 |
| JP | 11-003849 A | 6/1999 |
| WO | WO 0036470 A1 * | 6/2000 |
| WO | WO 02/27406 A2 | 4/2002 |

OTHER PUBLICATIONS

H. Dammann et al, "High-Efficiency In-Line Multiple Imaging by Means of Multiple Phase Holograms", Optics Communications, Jul. 1971, vol. 3, No. 5, pp. 312-315.

* cited by examiner

ILLUMINATION SYSTEM FOR A MICROLITHOGRAPHY PROJECTION EXPOSURE INSTALLATION

CROSS-REFERENCE TO RELATED APPLICATIONS

This application is a National Stage Entry of International Application No. PCT/EP2004/010188, filed on Sep. 13, 2004 in the European Patent Office. This application claims priority from DE 103 43 333.3, filed on Sep. 12, 2003 in the German Patent Office, and DE 10 2004 010 571.5, filed on Feb. 26, 2004 in the German Patent Office. The entire disclosures of the prior applications are hereby incorporated by reference.

BACKGROUND OF THE INVENTION

1. Field of the Invention

The invention relates to an illumination system for a microlithography projection exposure system for illuminating an illumination field with the light from a primary light source.

2. Description of the Related Art

The efficiency of projection exposure systems for the microlithographic production of semiconductor components and other finely structured components is determined substantially by the imaging properties of the projection objectives. Furthermore, the image quality and the wafer throughput that can be achieved with the system are also determined substantially by properties of the illumination system arranged upstream of the projection objective. This must be capable of preparing the light from a primary light source, for example a laser, with the highest possible efficiency and, in the process, of producing the most uniform intensity distribution possible in an illumination field of the illumination system. Moreover, it should be possible to set various illuminating modes (settings) of the illumination system, in order for example to optimize the illumination in accordance with the structures of the individual patterns (e.g. on masks, reticles) to be imaged. Possible settings between different conventional settings with various degrees of coherence and also annular field illumination and dipole or quadrupole illumination are usual. The unconventional illumination settings for producing off-axis, oblique illumination can be used inter alia to increase the depth of focus by means of two-beam interference and also to increase the resolving power.

EP 0 747 772 describes an illumination system having a zoom-axicon objective, in whose object plane there is arranged a first diffractive raster element with a two-dimensional raster structure. This raster element is used to increase the geometric light guidance valve (or extendue) of the incident laser radiation slightly and to change the form of the light distribution in such a way that, for example, the result is an approximated circular distribution, annular distribution or quadrupole distribution. In order to change between these illuminating modes, first raster elements are interchanged. A second raster element, which is located in the exit pupil of the objective, is illuminated by the corresponding light distribution and forms a rectangular light distribution, whose form corresponds to the entry surface of a following rod-like light mixing element. By means of adjusting the zoom-axicon, the annularity of the illumination and the size of the area that is lit up (illuminated) can be adjusted.

EP 1 109 067 (corresponding to US 2001001247) describes an illumination system in which a changing device is provided for the optional changing of different diffractive optical elements in the light path of the illumination system. By interchanging the diffractive optical elements, various illuminating modes can be set. The system manages without a zoom-axicon module.

Other known possibilities for achieving off-axis illumination are shown, for example, in the U.S. Pat. No. 5,638,211, EP 500 393 B1 (corresponding to U.S. Pat. No. 5,305,054), U.S. Pat. No. 6,252,647 or U.S. Pat. No. 6,211,944.

In the case of illumination systems which operate with interchangeable optical elements (for example diffractive optical elements or spatial filters) in order to set different illuminating modes, the number of different illumination settings is limited by the number of different changeable elements. Appropriate changing devices can be constructionally complex.

DE 199 44 760 A1 discloses an illumination device for printing plates which permits modulation of the illumination intensity in the integrated digital screen imaging process (IDSI). In this case, the light from a light source falls onto a digital light modulator having a two-dimensional array of cells, which can be activated and deactivated via a computer-controlled system in order to deflect a specific pattern onto a light-sensitive substrate, which is moved relative to the light modulator. In one embodiment, the light modulator comprises a micro mirror arrangement (digital mirror device, DMD) having a large number of individual mirrors that can be driven individually. During printing, those mirrors which are not used for the exposure of the light-sensitive material are tilted in such a way that they deflect the light beam falling on them away from light-sensitive material. By means of the control system, the number of individual mirrors used in the exposure is thus changed. A similar system is disclosed by WO 00/36470.

SUMMARY OF THE INVENTION

The object of the invention is thus to provide an illumination system for a microlithography projection exposure system which, with a simple construction, permits great variability in setting different illuminating modes.

In order to achieve this object, the invention provides an illumination system having the features of claim 1. Advantageous developments are specified in the dependent claims. The wording of all the claims is incorporated by reference in the content of the description.

An illumination system according to the invention has an optical axis and a light distribution device for receiving light from a primary light source and for producing a two-dimensional spatial intensity distribution which can be set variably in a pupil-shaping surface of the illumination system. The light distribution device has at least one optical modulation device for the controllable changing of the angular distribution of the radiation incident on the optical modulation device. The optical modulation device can comprise an array of individual elements that can be driven individually, which are able to effect a specific change in the angle or angular spectrum of the radiation in each case at the location of their installed position. The optical modulation device is also designated a locally variant optical modulation device, since the extent of the angular change can be set as a function of location. The array is preferably two-dimensional, for example having a plurality of rows and columns of individual elements. In this case, the individual elements are preferably driven in such a way that, in all the set illuminating modes, all of the light intensity incident on the individual elements of the optical modulation device is deflected into the usable region of the pupil-shaping surface and can thus contribute to the illumination of the illumination field. By means of the optical modulation device, a location-dependent redistribution of the light intensity can thus be effected, without incident light being "discarded". Therefore, an in principle largely loss-free, variable setting of different illuminating modes is possible.

As a result of the possibility according to the invention of deflecting small sections of the light incident on the optical modulation device specifically into predeterminable regions of the pupil-shaping surface, virtually any desired illumination intensity distributions can be set in the pupil-shaping surface. These include, for example, round, e.g. essentially circular, illumination spots of different diameters centred around the optical axis in the case of the conventional illumination settings and, in the case of the unconventional, off-axis types of illumination, annular illumination and polar intensity distributions, for example dipole illumination or quadrupole illumination. However, with illumination systems according to the invention, intensity distributions differing from this are also possible, for example multipole illumination with more than four poles, for example hexapole illumination. The illumination distributions do not necessarily have to have any symmetry in relation to the optical axis.

The pupil-shaping surface of the illumination system, in which the desired intensity distribution is to be present, in an illumination system incorporated in a microlithography projection exposure system can be positioned at or close to a position which is optically conjugate with a pupil plane of a following projection objective. In general, the pupil-shaping surface can correspond to a pupil surface of the illumination system or be located in its vicinity. If the interposed optical components operate so as to maintain angle (angle conserving elements), the spatial light distribution in the pupil of the projection objective is thus determined by the spatial light distribution (location distribution) in the pupil-shaping surface of the illumination system. If the illumination system comprises, for example, a fly's eye condenser as light-mixing element (light integrator), then the pupil-shaping surface can be located in the vicinity of its entry side or can coincide with the latter. In the case of systems which comprise one or more rod-like light integrators (rod integrators) operating with internal reflection, the pupil-shaping surface can be a plane that is Fourier-transformed in relation to the entry surface of the light integrator or can be located in its vicinity. Systems are also possible in which none of the aforementioned classical light mixing elements is present. Here, homogenization of the intensity distribution can, if appropriate, be carried out by means of suitable superimposition of partial beams by means of prisms or the like.

The terms "radiation" and "light" in the sense of this application should be interpreted widely and in particular are intended to cover electromagnetic radiation from the ultraviolet range, for example at wavelengths of about 365 nm, 248 nm, 193 nm, 157 nm or 126 nm. Also covered is electromagnetic radiation from the extreme ultraviolet range (EUV), for example soft X-rays with wavelengths of less than 20 nm.

In one development, the optical modulation device is formed as a mirror arrangement having an array of individual mirrors that can be controlled individually for changing the angular distribution of the radiation incident on the mirror arrangement. The individual mirrors which form the individual elements of the modulation device can be arranged in the manner of a raster in a one-dimensional or two-dimensional array. According to another development, the optical modulation device is formed as an electro-optical element, which preferably comprises a one-dimensional or two-dimensional field arrangement (array) of controllable diffraction gratings or a corresponding array of acousto-optical elements. Each of these individual elements, which are arranged in that manner of a raster and accordingly can also be designated raster elements, introduces at the location of the raster element a specific angle or angular spectrum of the radiation output, as a rule a beam deflection of the incident radiation, that is to say a change in the propagation direction, being introduced. By means of driving the individual elements electrically, for example, the angular distribution of the radiation output can be set variably.

The space between the light modulation device and the pupil-shaping surface can be free of optical components, such as lenses or other imaging elements. In this case, it is beneficial to choose the distance between light modulation device and pupil-shaping surface to be so great that the pupil-shaping surface lies in the far-field region of the light modulation device. Under these conditions, the desired spatial intensity distribution is established automatically in the pupil-shaping surface.

In one development, an optical system for converting the incident angular distribution into a spatial distribution (distribution in the location space) in the pupil-shaping surface is provided between the optical modulation device and the pupil-shaping surface. This optical system is thus intended to carry out a Fourier transformation of the angular distribution into the pupil-shaping surface. In this case, it can be an individual optical element, for example a lens with a fixed focal length and therefore a defined magnification. The optical system used for the Fourier transformation preferably has a focal length that can be set variably. It can be configured as a zoom objective. As a result, with a given illumination distribution, the size of the region in the pupil-shaping surface that can be lit up with this illumination distribution can be set, preferably continuously. If an axicon system with conical surfaces is provided between the optical modulation device and the pupil-shaping surface, a desired level of the annular field character (annularity) of the illumination can be set, continuously if appropriate, by adjusting the axicon system. In one embodiment, a zoom-axicon objective, whose structure can correspond for example to the construction of the zoom-axicon objective described in EP 0 747 772, can be arranged between the optical modulation device and the pupil-shaping surface. In this case, the optical modulation device can be used in the place of the first diffractive raster element shown there. The disclosure content of EP 0 747 772 is incorporated by reference in the content of this description.

The optical modulation device can operate reflectively and can be aligned obliquely with respect to the optical axis in the manner of a deflection mirror in order, for example, to achieve on average an approximately 90° deflection (or a deflection by a smaller or larger angle).

For the function of the optical components of the illumination system which follow the pupil-shaping surface, it is generally beneficial if the angles at which the rays are incident in the pupil-shaping surface are as small as possible. For this purpose, in preferred embodiments, provision is made to select the optical distance between optical modulation device and the pupil-shaping surface to be so great that the angles between the optical axis and light beams of the angular distribution in the region of the pupil-shaping surface are less than about 5°, in particular less than about 3°. The smaller the angles are selected, the steeper is it possible, for example, for the flanks at the light/dark transition between the illuminated region and the adjacent non-illuminated region to be.

A finely divided, specific setting of various forms of an area of the pupil-shaping surface to be illuminated can be of great benefit particularly in systems which use one or more fly's eye condensers as light mixing elements. In such systems, as is known, the desired evening out of the intensity distribution downstream of the fly's eye condenser (honeycomb condenser) can be achieved only if the individual radiation channels formed by the "honeycombs" are either used completely or not used at all. On the other hand, the radiation from an only partly used radiation channel impairs the uniformity. For this reason, conventional systems operate with masks, in order for example to block partially illuminated channels at the edge of an illumination region. This can lead to light losses.

In an embodiment of the invention having at least one fly's eye condenser, in which the pupil-shaping surface normally lies in the region of the entry surface of the fly's eye condenser or in a surface which is optically conjugate therewith, the spatial intensity distribution in the pupil-shaping surface can on the other hand be controlled or set in such a way that specifically only completely illuminated and completely non-illuminated channels (or honeycombs) exist and partially illuminated "honeycombs" are avoided. It is then possible to dispense with the use of aperture stops for blocking individual channels. Thus, with a simplified construction, largely loss-free illumination control becomes possible.

To this end, in one embodiment the light distribution device has at least one diffractive optical element arranged optically between the optical modulation device and the pupil-shaping surface for receiving light emerging from the optical modulation device and for modifying the light by introducing an angular distribution according to an effect function defined by the configuration of the diffractive optical element. Due to this construction the angular distribution of light created by the optical modulation device is optically folded with the angular distribution created by the diffractive optical element in the optical far field.

The effect function may be such that a beam emerging from an individual element of the optical modulation device is shaped by the diffractive optical element to conform to the shape and size of one single optical channel or a group of adjacent optical channels of the fly's eye condenser. Particularly, the diffractive structure of the diffractive optical element can be such that a rectangular illumination field can be created from a beam emerging from a single optical element of the optical modulation device. The rectangular shape can be dimensioned to conform to one single optical channel of the fly's eye condenser. In other embodiments the illuminated area can be dimensioned to cover a group of neighbouring optical channels.

According to one embodiment, the diffractive optical element is a computer generated hologram (CGH) having diffractive structures periodically repeating across the cross section of the diffractive optical element.

If a mirror arrangement of the optical modulation device is used, then the minimum size of the illuminated surfaces which are produced by the individual mirrors of the mirror arrangement is normally determined substantially by the size of the individual mirrors which, for example, can be flat mirrors. It is possible to reduce the minimum extent of the light spots produced by the individual mirrors not being formed as flat mirrors but as curved mirrors with a finite mirror focal length. The focal length can be dimensioned such that the radiation incident on the individual mirrors is incident on the pupil-shaping surface in substantially focused form. As a result, very differentiated setting of various spatial intensity distributions in the pupil-shaping surface is possible.

The individual mirrors of the mirror arrangement can all have the same shape and size, which may be beneficial in terms of fabrication. It is also possible for the individual mirrors to comprise a first mirror group and at least a second mirror group each having one or more individual mirrors, and for the individual mirrors of the mirror groups to have a different size and/or different shape and/or different curvature. If, for example, the size of the individual mirrors is varied, then this can be used to divide up the tasks among the individual mirrors of the mirror arrangement. For instance, the individual mirrors with a larger area can produce the greater proportions of the light spots produced, while smaller individual mirrors permit the production of a fine structure of the light distribution.

In general, the individual mirrors can in each case be viewed as producers of specific basic light distributions, which are then assembled to form the desired distribution in the pupil-shaping surface of the illumination system, by the light distributions produced being displaced relative to one another. The variation in the angular distribution, and therefore the displacement of spots of light in the pupil-shaping surface, can be achieved, for example, by suitable tilting of individual mirrors about at least one tilt axis.

A further degree of freedom in the production of spatial light distributions can be created by at least some of the individual mirrors having a diffractive optical structure or a structure with a comparable effect for forming the distribution of the radiation reflected from the individual mirror. As a result, the "basic distribution" which is produced by this individual mirror can still intrinsically be shaped. For example, an individual mirror can be designed in such a way that it produces a basic distribution which can consist of a plurality of spots of light, which do not have to be contiguous.

The individual mirrors of the mirror arrangement preferably adjoin one another directly, so that they form a faceted, substantially closed, contiguous reflecting surface. In order to facilitate relative mobility of adjacent individual mirrors, it may be beneficial if, between the individual mirrors, there are small distances or gaps, which result in narrow, non-reflective regions. In particular in the case of such embodiments, it is beneficial if in front of the mirror arrangement there is arranged an optical device for concentrating radiation incident on the optical device onto individual mirrors of the mirror arrangement. The optical device may be a two-dimensional raster arrangement of optical elements or a diffractive optical array generator. In this way, incident light, for example from a laser, can be led onto the individual mirrors in focused form, by which means reflection losses at the mirror arrangement can be reduced to a minimum.

A two-dimensional raster arrangement can comprise, for example, a two-dimensional array having telescope lens systems, which is preferably arranged in the largely collimated beam path upstream of the mirror arrangement. There may be a 1:1 association between the optical elements of the raster arrangement and the following individual mirrors.

In particular in conjunction with individual mirrors of different shape and/or size, it may be beneficial likewise to design the individual optical elements of the raster arrangement differently. If, for example, regions of different size of the widened beam coming from the light source are focused to form light beams which are then aimed at the individual mirrors, a variation in the light energy on the individual mirrors of the mirror arrangement can be achieved. In this way, the radiation energy content of the individual basic light distributions can be changed. A comparative effect could also be achieved by means of a suitable transmission filter upstream and/or downstream of the two-dimensional raster arrangement, but light losses would have to be tolerated.

If a diffractive optical array generator is used, the transformation of an incoming beam into a plurality of light beams concentrated on individual optical elements of an array-type optical modulation device can be achieved with an optical element with simple construction. Optical array generators suitable for creating a number of separate light fluxes from one incoming light flux are described e.g. in the article "Beam Shaping with Optical Array Generators" by N. Streibl, J. Mod. Optics 36 (1989) pages 1559-1573. In one embodiment an optical array generator designed as so called "Dammann grid" is used. High efficiency multiple phase holograms of this type are described in the article "High Efficiency in-line Multiple Imaging by means of Multiple Phase Holograms" by H. Dammann, K. Görtler in: Optics Commun. 3 (1971) pages 312-315. Using diffractive optical array generators for concentrating light on individual elements of an array-type optical modulation device provides high efficiency (low light loss) at low cost.

For the construction and/or the driving of the individual mirrors of the mirror arrangement, recourse can be had to known concepts from the prior art, adaptations to the respective illumination system possibly having to be made with regard to dimensioning. Mirror arrangements having individual mirrors that can be driven individually, which are frequently also designated a digital mirror array (DMD), are known for example from systems for maskless lithography (cf., for example, U.S. Pat. No. 5,523,193; U.S. Pat. No. 5,691,541; U.S. Pat. No. 5,870,176 or U.S. Pat. No. 6,060,224).

Some measures, explained using the example of the individual mirrors, for configuring the output radiation produced by the optical modulation device can also be provided with the same effect in an electro-optical element having controllable diffraction gratings or acousto-optical elements. These include the possibility of tilting the individual elements relative to one another, the possibility of influencing a basic distribution of the light output from an individual element by means of suitable configuration of the individual elements, or the measure of providing optical elements for concentrating the incident radiation onto the angle-changing individual elements upstream of the corresponding optical modulation device, for the efficient use of controllable diffraction gratings or acousto-optical elements. The individual elements of the electro-optical element can be configured identically or differently from one another.

In particular in embodiments of illumination systems for microlithography, it is beneficial to use a light mixing device in the illumination system, in order to achieve a high level of uniformity or homogeneity of the illumination falling onto the illumination field. In illumination systems according to the invention, both light mixing devices having fly's eye condensers and light mixing devices having one or more integrator rods or light mixing rods or combinations thereof can be used. Such light mixing devices are available both respectively in a refractive design (fly's eye condenser having lens elements, integrator rod made of transparent material) and in a reflective design (fly's eye condenser having concave mirrors, hollow rod with internal reflection).

The invention also relates to a method of illuminating an illumination field with the light from a primary light source, the illumination field being in particular the object plane of a microlithography projection objective or a plane conjugate therewith. The illumination method comprises changing the angular distribution of the light incident in the illumination field in the light path between light source and illumination field. The change is brought about by the light from a primary light source being guided onto an optical modulation device having at least two individual elements that can be varied independently of one another and these individual elements being set suitably relative to one another. This setting can comprise, for example, tilting at least one of the individual elements with respect to the other individual element about one or more tilt axes or changing the diffractive properties of diffraction elements. The result, downstream of the light modulation device, is an angular distribution of the light which depends on the relative setting of the individual elements and which, by means of following optical components, is transformed into an angular distribution of the light incident in the illumination field. The light output by the light modulation device preferably has considerably more than two beams of light that can be set independently of one another, for example at least 10 or at least 50 or at least 100 beams of light that can be set individually.

BRIEF DESCRIPTION OF THE DRAWINGS

The above and further features emerge from the description and the drawings as well as from the claims, its being possible for the individual features to be implemented in each case on their own or in a plurality in the form of sub-combinations in embodiments of the invention and in other fields and to represent embodiments which are advantageous and intrinsically capable of protection.

DETAILED DESCRIPTION OF EXEMPLARY EMBODIMENTS OF THE INVENTION

Figure 1:
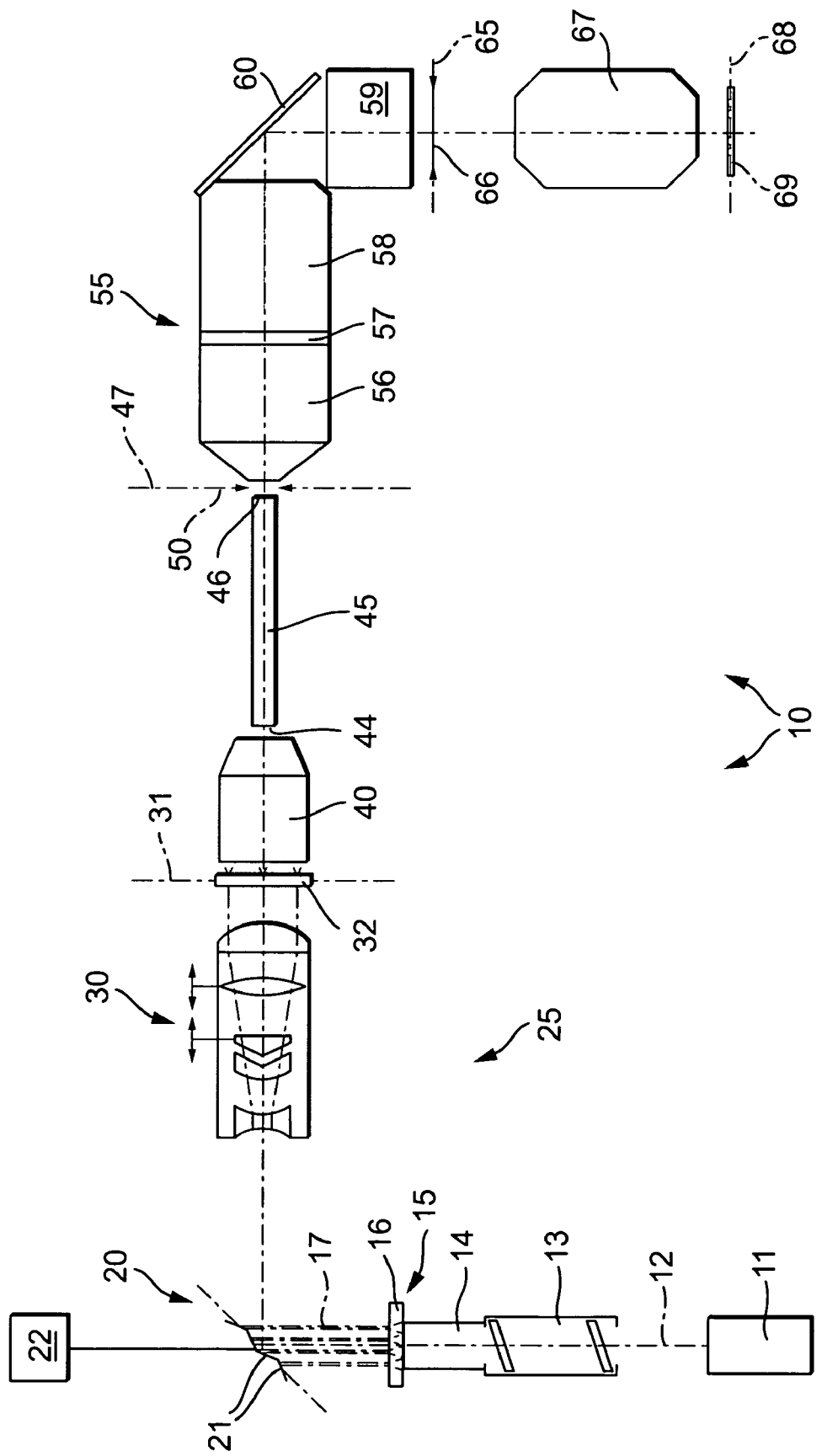
FIG. 1 shows a schematic overview of an embodiment of an illumination system for a microlithography projection exposure system, having an embodiment of an optical modulation device which comprises a mirror arrangement with many individual mirrors.

FIG. 1 shows an example of an illumination system 10 of a projection exposure system for microlithography, which can be used in the production of semiconductor components and other finely structured components and, in order to achieve resolutions down to fractions of micrometers, operates with light from the deep ultraviolet range. The light source 11 used is an $F_2$ excimer laser having an operating wavelength of about 157 nm, whose light beam is aligned coaxially with respect to the optical axis 12 of the illumination system. Other UV light sources, for example ArF excimer lasers with 193 nm operating wavelength, KrF excimer lasers with 248 nm operating wavelength or mercury vapour lamps with 365 nm or 436 nm operating wavelength or light sources with wavelengths below 157 nm are likewise possible.

The light from the light source 11 is firstly incident into a beam expander 13, which widens the laser beam and, from the original beam profile with a cross section of 20 mm×15 mm, produces a widened profile 14 with a cross section of 80 mm×80 mm. In the process, the divergence angles decrease from about 4 mrad×2 mrad to about 1 mrad×0.4 mrad.

Downstream of the beam expander there follows a two-dimensional raster arrangement 15 of telescope lens systems 16, which, from the widened beam 14, produces a set of regularly arranged, mutually parallel beams 17, which each have a lateral spacing from one another.

The light divided up into beams 17 or partial beams 17 strikes a mirror arrangement 20 serving as a location-variant (or space variant) optical modulation device, which is aligned macroscopically at an angle of about 45° with respect to the optical axis 12 and, in the manner of a deflection mirror, on average effects 90° folding of the optical axis. Other angular positions and deflection angles are also possible. One advantage of small angles is the fact that the object plane of the following zoom system is located more beneficially, and thus the expenditure for the zoom system can be reduced. The mirror arrangement 20 comprises a large number of individual, small, individual mirrors 21 which are flat in the example, which adjoin one another directly with very small interspaces and impart a faceted mirror surface overall to the mirror arrangement 20. Each of the individual mirrors 21 can be tilted about two tilt axes aligned perpendicular to each other, independently of the other individual mirrors. The tilting movements of the individual mirrors can be controlled by a control device 22 via electrical signals to corresponding individual drives. The mirror arrangement 20 is a substantial constituent part of a light distribution device 25 and is used for the purpose of changing the angular distribution of the radiation incident on the mirror arrangement specifically in a locally resolved manner.

The mirror arrangement 20 is arranged in the region of the object plane of a zoom-axicon objective 30, which is arranged downstream thereof in the beam path and in whose exit pupil 31 a diffractive optical raster element 32 is arranged. The exit pupil 31 is here also designated the pupil-shaping surface of the illumination system. The components arranged upstream thereof in the light path are used to set a two-dimensional spatial intensity distribution, which can be set variably, in this pupil-shaping surface.

In detail, this basic structure can be implemented as follows, for example. The widened laser beam 14 striking the telescope lens array 15 is divided up by the segments of the telescope array into a large number of individual beams. A subregion of 4 mm×4 mm of the widened laser beam is in this case reduced by a telescope segment of the telescope array to a beam 17 having the dimensions of 2 mm×2 mm. In this way, 20×20=400 partial beams or beams 17 are produced. These strike the associated individual mirrors 21 of the mirror arrangement, which are in each case flat and have a size of 3 mm×3 mm. Each of the individual mirrors is located in a square region of 4 mm×4 mm. These regions are located beside one another on a square grid, so that there is a total of 20×20=400 individual mirrors.

Figure 2:
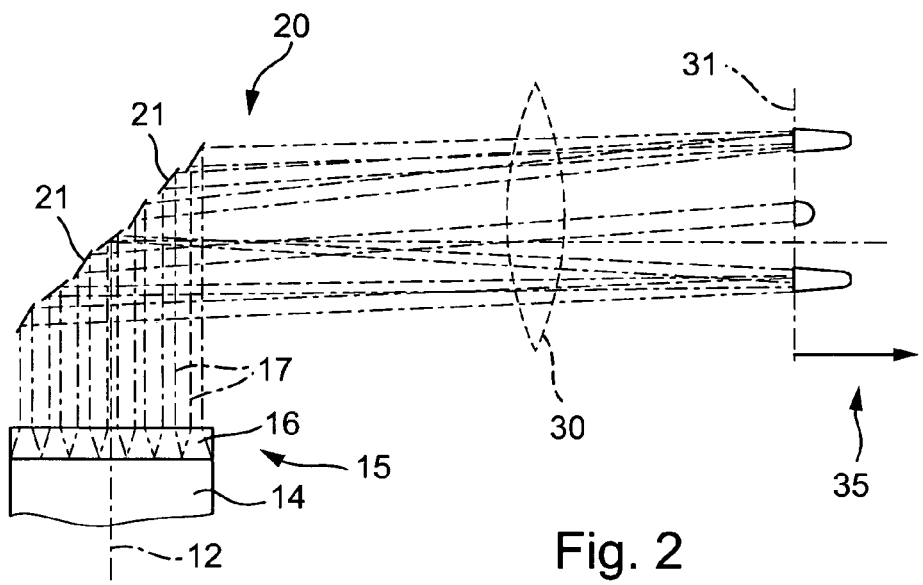
FIG. 2 shows a schematic illustration to explain the function of the mirror arrangement.

In the embodiment, the axial spacing between the telescope lens array 15 and the mirror arrangement 20 is about 100 mm. The axial spacing between the mirror arrangement and the pupil-shaping surface 31, in which the refractive optical grid element 31 is situated, is more than 1000 mm. The maximum diameter of the region which is lit up in the pupil-shaping surface 31 is designed to be about 100 mm. Given this geometry, only relatively small beam angles with values of less than about 2.9° enter the pupil-shaping surface 31. This can be achieved under the assumption that the individual mirrors located above the optical axis (in FIG. 2) influence only the light distribution in the upper half of the pupil-shaping surface 31, and the individual mirrors located below the optical axis influence only the lower half of this illumination region. A part beam or an individual beam is normally widened by at most about 1.1 mm on the light path of about 1100 mm. This value limits the minimum size of the spot of light which is produced in the pupil-shaping surface 31 by an individual beam reflected from an individual mirror.

Injection optics 40 (coupling-in optics) arranged downstream of the pupil-shaping surface 31 transmit the light of the intensity distribution to the rectangular entry surface 44 of a rod-like light integrator 45 which is fabricated from synthetic quartz glass (or calcium fluoride) and which mixes and homogenizes the light passing through by means of multiple internal reflection. The pupil-shaping surface 31 is a Fourier-transformed plane in relation to the entry surface 44, so that a spatial intensity distribution in the plane 31 is transformed into an angular distribution at the rod entry 44. Immediately at the outlet surface 46 of the rod 45 there is an intermediate field plane 47, in which a reticle masking system (REMA) 50 is arranged, which is used as an adjustable field stop. The following objective 55 projects the intermediate field plane 47 having the masking system 50 onto a plane 65, which is also designated the reticle plane here. In the reticle plane 65 there is arranged a reticle 66. The plane 47 of the reticle masking system and the reticle plane 65 are planes in which an illumination field of the illumination system lies. The reticle plane 65 coincides with the object plane of a projection objective 67, which projects the reticle pattern into its image plane 68, in which a wafer 69 coated with a photoresist layer is arranged. The objective 55 contains a first lens group 56, an intermediate pupil plane 57, into which filters or aperture stops can be introduced, a second and a third lens group 58, 59 and a deflection mirror 60 which is located between them and which makes it possible to incorporate the large illumination device horizontally and to mount the reticle horizontally.

Together with the projection objective 67, the illumination system 10 forms an adjustable reticle holder, which holds the reticle 66 in the object plane 65 of the projection objective, and an adjustable wafer holder of a projection exposure system for the microlithographic production of electronic components, but also of optically diffractive elements and other microstructured parts. The illumination system can be used both in a wafer stepper and in a wafer scanner.

The illumination system is constructed in such a way that it introduces the complete etendue (geometric light guidance valve) in a number of stages. Because of the extensive parallelism of the radiation and of the small beam cross section, the light beam emitted by the laser has a very low etendue, which is possibly increased by the beam widening and by the division of the beam with the aid of the telescope array 15. Depending on the position of the individual mirrors 21 and the angular distribution which can be achieved as a result, the etendue is increased further by the mirror arrangement 20, the shape of the distribution of the radiation also being changed. The zoom-axicon system 30 is designed for a projection at infinity. The arrangement arranged in the region of the front focal plane of the zoom-axicon system 30, together with the zoom-axicon optics, prepares a two-dimensional intensity distribution of variable size in the exit pupil 31 of the zoom system, which serves as the pupil-shaping surface. The refractive raster element 32 arranged here has a rectangular emission characteristic, produces the main proportion of the etendue and adapts the etendue via the injection optics 40 to the field size, that is to say to the shape of the rectangular entry surface 44 of the rod integrator 45.

The tilting positions of the individual mirrors 21 are set by the control device 22 via suitable electrical signals, any desired orientations of the individual mirrors being possible on account of the possibility of tilting about two axes. However, the tilting actions are limited mechanically or electronically to small tilting angles such that, during each possible setting of the individual mirrors, all of the radiation reflected from the mirror arrangement can enter the objective 30. By means of the tilting of the individual mirrors 21, the beams originating from the latter are reflected to various locations of the pupil-shaping surface 31 (a pupil plane of the illumination system). The characteristics of the two-dimensional light distributions 35 which can be produced in this way are in principle limited only by the size of the individual spots of light. The desired size of the spots of light that can be produced can be achieved, for example, by means of suitable curvature of individual mirrors. It would also be conceivable to design the individual mirrors as adaptive mirrors, in which the shape of the mirror surface can be varied to a limited extent via suitable actuators, for example piezoelectrically.

In the application of the invention illustrated here, it is of critical importance that the distribution of the light in the pupil-shaping surface 31 (a pupil plane of the illumination system) can be set as a function of the structure of the mask 66 in the reticle plane 65. By means of suitable, computer-controlled alignment of the individual mirrors, all the familiar two-dimensional illuminating light distributions can be set in the first pupil-shaping surface 31, for example conventional illuminations with different diameters, annular settings, quadrupole or dipole settings. Differing from other systems, it is moreover also possible to set any other desired light distributions variably in the pupil-shaping surface 31. No replacement of optical components is necessary for the change between the settings. Above all, the light distribution in the pupil plane 31 can be set without the aid of filters, aperture stops or other elements that cause light losses. This also applies in particular to other embodiments in which the light mixing element used is a fly's eye condenser, whose entry side should preferably be arranged in the region of the pupil-shaping surface 31. The ability specifically to set virtually any desired light distributions in the pupil-shaping surface 31 can also be used for the purpose of influencing some pupil properties such as pupil ellipticity or polar balance. This can be very advantageous, since the intensity distribution of conventional laser beams in no way has the desired form with a sharp light-dark transition (the form of a top-head function). In the embodiment, the angles at which the light beams open into the pupil plane 31 are at most about 3°. This has a positive effect on the filling of the rod integrator 45.

Figure 3:
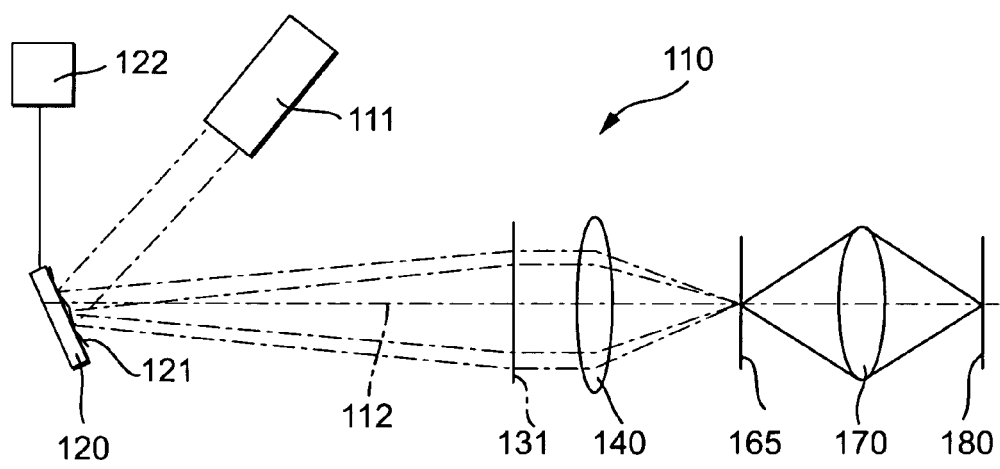
FIG. 3 shows a simple embodiment of an illumination system in which the desired light distribution is produced without any optical projection elements in the far field of the optical modulation device.

A simplified embodiment of an illumination system will be described by using FIG. 3. In the illumination system 100, the light from a laser light source 111 is incident at an angle of incidence of about 25° on a mirror arrangement 120 which is aligned obliquely with respect to the optical axis 112 and has a large number of individual mirrors 121 that can be driven individually and respectively tilted about two tilt axes. Here, the smaller the angle of attack of the mirror arrangement is in relation to the irradiation direction, the lower are the light losses in this embodiment, since there are no means of focusing the radiation onto the individual mirrors. The mirror arrangement 120 is used as a location-variant optical modulation device and forms the light distribution device 125 of this system, is driven by the control device 122 and is at such a great distance from the pupil-shaping surface 131 of the illumination system, in which the desired two-dimensional intensity distribution is to be present, that the pupil-shaping surface 131 lies in the region of the far field of the mirror arrangement 120. In this case, the desired intensity distribution is automatically established in the region of the pupil-shaping surface 131 without the angular distribution output from the mirror arrangement 120 having to be converted into a spatial distribution by Fourier transformation by means of a lens or optics of comparable effect. A field lens 140 arranged downstream of the pupil-shaping surface 131 transforms the intensity distribution into a following field plane 165 in which, for example, a mask to be illuminated is located and is illuminated from the desired direction. Following projection optics 170 project the pattern of the reticle onto a wafer covered with a light-sensitive coating in the image plane 180 of the projection objective 170.

Figure 4:
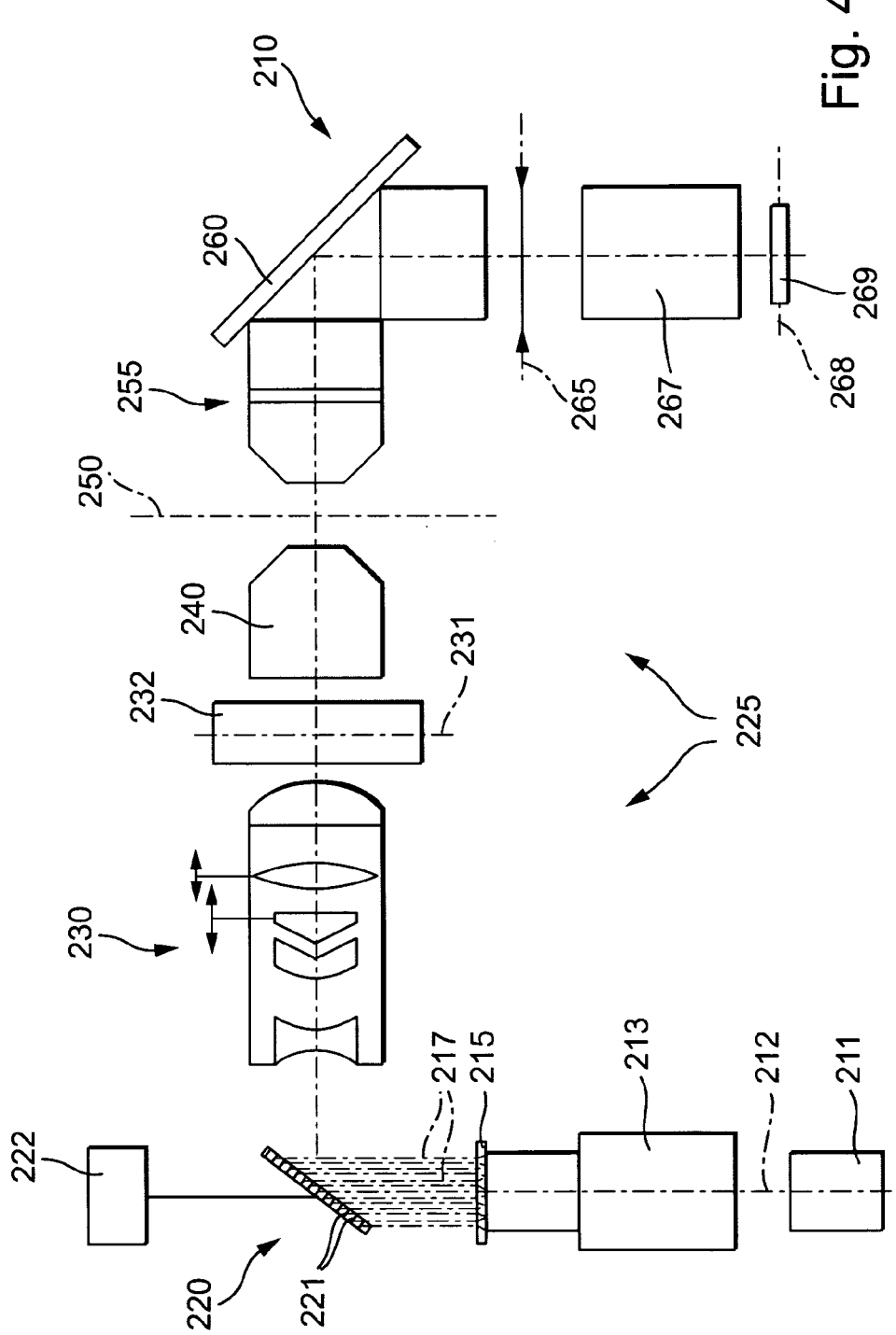
FIG. 4 shows a schematic overview of another embodiment of an illumination system for a microlithography projection exposure system, in which the optical modulation device comprises a raster arrangement of controllable diffraction gratings and a raster element arranged in the pupil-shaping surface serves as the light mixing device.

The structure of the illumination system 210 in FIG. 4 is derived from the structure of the illumination system shown in FIG. 1, for which reason mutually corresponding features and components have corresponding reference symbols, increased by 20°. Differences from the system according to FIG. 1 exist, firstly, in the structure of the location-variant optical modulation device 220 and, secondly, in the concept of the light mixing. In this regard, it is worth noting that the illumination system 210 is constructed without a special light mixing element, that is to say without an integrator rod or fly's eye condenser. As in the embodiment according to FIG. 1, the light from the laser light source 211, after passing through a beam expander 213 and a two-dimensional raster arrangement 215 of telescope lens systems, is present as a set of regularly arranged, mutually parallel beams 217, which in each case have a lateral spacing from one another. The beams or part beams 217 are in each case aimed at individual elements 221 of the optical modulation device 220. The latter is constructed as an electro-optical element and has a large number of controllable, reflective diffraction gratings 221, which form the individual elements of the optical modulation device, are arranged physically in a two-dimensional raster or grid and can be set and changed independently of one another with respect to their diffraction properties by the control device 222. With the aid of electrical signals, it is thus possible to set the angular distribution of the radiation reflected from the optical modulation device 220 in the direction of the zoom-axicon objective 230 in a variable manner. In another embodiment, the individual elements of the optical modulation device are formed by acousto-optical elements.

The optical modulation device 220 is fitted in the region of the object plane of the zoom-axicon objective 230, whose exit pupil 231 is the pupil-shaping surface of the illumination system. In the pupil-shaping surface 231 or in its vicinity there is arranged a raster element 232 having a two-dimensional arrangement of diffractive or refractive optical elements which, in this embodiment, has a plurality of functions. Firstly, by means of the raster element 232, the incoming radiation is shaped in such a way that, after passage through the subsequent injection optics 240 in the region of the field plane 250 of the illumination system, it lights up a rectangular illumination field. The raster element 232 with rectangular emission characteristics in this case produces the main part of the etendue and adapts this to the desired field size and field shape in the field plane 250, which is optically conjugate with the reticle plane 265 and in which the reticle-mask system is arranged. The raster element 232 can be implemented as a prism array, in which the individual prisms arranged in a two-dimensional array introduce locally determined angles in order to light up the field plane 250 as desired. The Fourier transformation carried out by the injection optics 240 has the effect that each specific angle at the exit from the raster element 232 corresponds to a location in the field plane 250, while the location of the raster element, that is to say its position in relation to the optical axis 212, determines the illumination angle in the field plane 250. The beams leaving the individual raster elements are in this case superimposed in the field plane 250. By means of suitable design of the raster element and its individual elements, it is possible for the rectangular field in the field plane 250 to be lit up substantially homogeneously. The raster element 232 thus serves also to homogenize the field illumination, so that it is possible to dispense with a separate light mixing element, such as the integrator rod 45 of the embodiment according to FIG. 1. Since no separate light mixing element is required between the pupil-shaping surface 231 and the exit plane 265 of the illumination system (reticle plane), illumination systems of this type can be designed particularly compactly in this area.

A field-shaping and homogenizing element of the type of the raster element 232 which, in combination with Fourier optics connected downstream, is used firstly to set a field size and shape and, secondly, to homogenize the illumination in this field, can of course also be used in the embodiment according to FIG. 1 in combination with a mirror arrangement as optical modulation device. In this case, it is possible to dispense with the integrator rod 45. Secondly, the mirror arrangement according to FIG. 1 can also be replaced by an electro-optical optical modulation device having controllable diffraction gratings or opto-acoustic elements. As an alternative to the reflective diffraction gratings according to FIG. 4, the use of transmission diffraction gratings in an optical modulation device is also possible.

Figures 5, 5A:
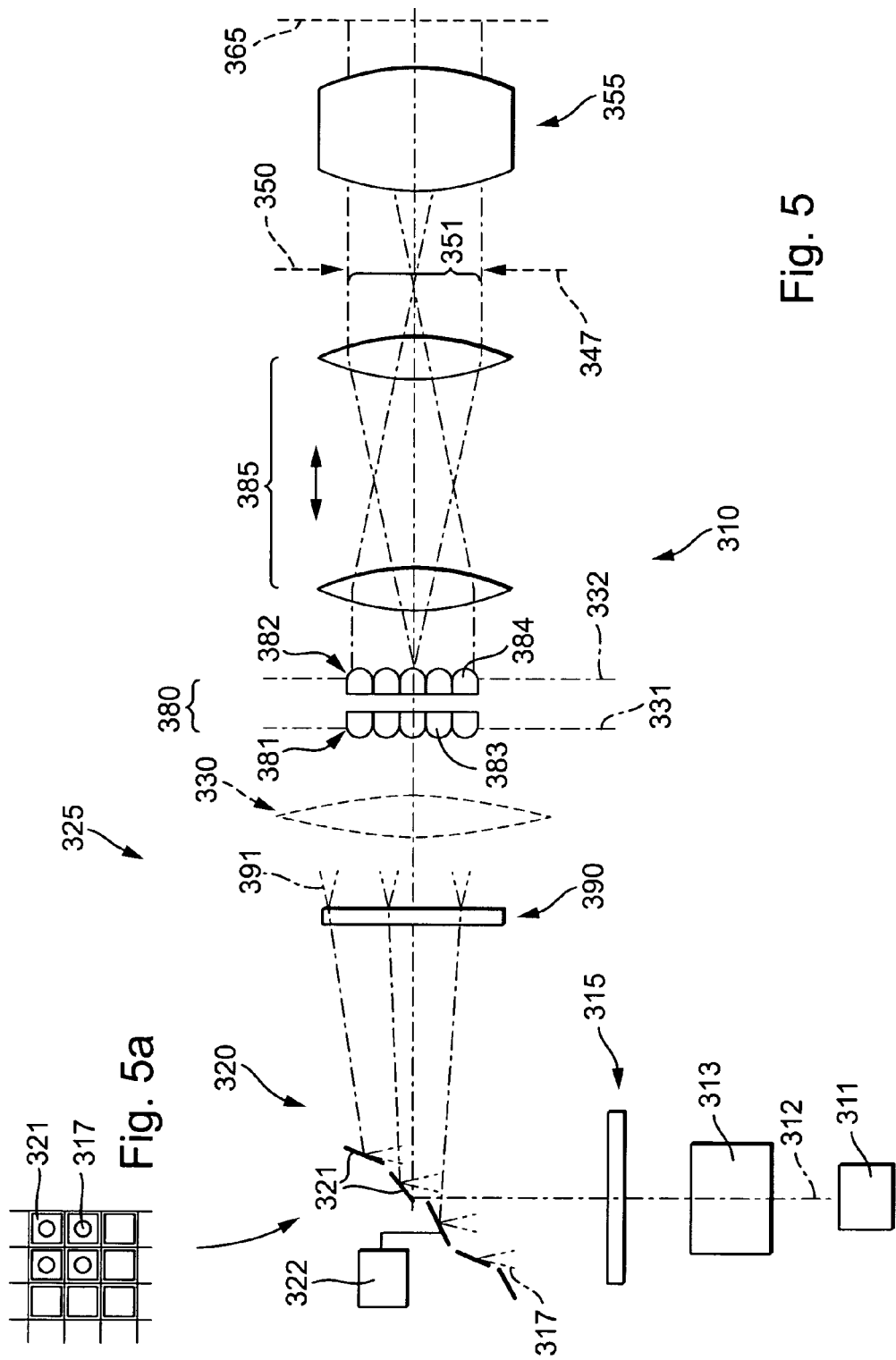
FIG. 5 shows a schematic overview of another embodiment of an illumination system for a microlithography projection exposure system having a light distribution device with diffractive optical elements for concentrating light on an array type optical modulation device and for forming light spots adapted to optical channels of a fly's eye condenser.

In FIG. 5 another embodiment of an illumination system 310 using a fly's eye condenser 380 as a light mixing element is shown schematically. Linearly polarized radiation emanating from a laser light source 311 is shaped by a light distribution device 325 into variably selectable two-dimensional intensity distributions in a pupil-shaping surface 331 arranged in the vicinity of the entry side of the fly's eye condenser 380. The light distribution device 325 includes, a beam expander 313, a first diffractive optical element (DOE1) 315, a mirror arrangement 320 serving as location variant (or space variant) optical modulation device (which is aligned macroscopically at an angle of about 45° with respect to the optical axis 312 and has a large number of individual mirrors 321 tiltable about two mutually perpendicular tilt axes), a second diffractive optical element (DOE2) 390 arranged downstream of the mirror arrangement 320, and optionally an optical system 330 for transforming an angular distribution of radiation entering the optical system 330 into a spatial distribution of light in the pupil shaping surface 331.

The fly's eye condenser 380 consists of a first raster arrangement 381 of first cylindrical lens 383 and a second raster arrangement 382 having second cylindrical lens 384. The lenses 383 of the first raster arrangement 381 have identical refractive power and rectangular cross section where the rectangular shape of the cylindrical lens 383 corresponds to the rectangular shape of the illumination field 351 to be illuminated. Therefore the first lenses 383 are also named "field honeycombs". The cylindrical lenses 383 are arranged immediately adjacent to one another in a rectangular raster substantially filling the area in or in the vicinity of the pupil-shaping surface 331 (which is a pupil plane of the illumination system).

The first cylindrical lenses 383 have the effect that light incident on the plane 331 is divided up into a number of beams of light corresponding to the number of cylindrical lenses 383 that are illuminated, where those light beams are focused on to a field plane 332 of the illumination system that lies in the focal plane of these cylindrical lenses 383. In this field plane, or in the vicinity thereof, the second raster arrangement 382 is positioned having second cylindrical lenses 384 of rectangular cross section and positive, identical refractive power. Each cylindrical lens 383 of the first raster arrangement 381 project the light source 311 on to a respectively associated second cylindrical lens 384 of the second raster arrangement 382 so that a large number of secondary light sources is produced. The cylindrical lenses 384 of the second raster arrangement are frequently also designated "pupil honeycombs". A pair of mutually associated first and second cylindrical lenses 383, 384 of the first and second raster arrangements 381, 382 form an optical channel. The first and second raster arrangement 381, 382 form the fly's eye condenser 380, which has a large number of optical channels arranged in an two-dimensional array.

The cylindrical lenses 384 of the second raster arrangement 382 are arranged in the vicinity of the respective secondary light sources and project the rectangular first cylindrical lenses 383 onto an intermediate field plane 347 of the illumination system via a field lens 385 arranged downstream of the fly's eye condenser. The field lens 385 is a zoom lens designed to vary the focal length continuously. The rectangular images of the first cylindrical lenses (field honeycombs) 383 are superimposed in this intermediate field plane. This superimposition has the effect of homogenizing or evening out the light intensity in the region of this intermediate field plane, whereby a homogeneous illumination of the rectangular illumination field 351 is obtained.

As in the embodiments mentioned above, a reticle-masking system (REMA) 350 is arranged in the intermediate field plane 347 serving as an adjustable field stop. The following objective 355 projects the intermediate plane 347 onto the illumination surface 365 where a reticule (the mask or the lithography original) can be positioned.

One characterizing feature of this embodiment is the first diffractive optical element 315 arranged at a distance upstream of the mirror arrangement 320 between the light source 311 and the mirror arrangement 320. The diffractive optical element 315 is designed as an optical array generator for concentrating radiation incident on the diffractive optical element onto the individual mirrors 321 of the mirror arrangement, whereby potential light loss caused by illuminating gaps between the usable mirror surfaces of the individual mirrors 321 can be avoided. The first diffractive optical element 315 is designed as a diffractive fan-out element creating, from a single parallel light beam impinging on the diffractive optical element, a number of focused light beams 317 corresponding to the number of individual mirrors 321 and directed such that the light beams are concentrated in the optically active area of the individual mirrors 321 (see inset FIG. 5 (a)). A fan-out element in the form of "Damann grating" creating a multitude of diffraction orders positioned at the individual mirrors 321 is used for this purpose. Although a telescope lens array such as described in connection with FIG. 1 may be used instead of the diffractive optical element 315, a diffractive optical element may be preferable due to the simpler construction as compared to a telescope lens array. Also installation space maybe conserved.

Using one or more diffractive optical element for concentrating light on individual elements of an optical modulation device having an array structure of individual elements that can be driven individually to change the angle or angular spectrum of the radiation incident on the individual elements can also be used in connection with other optical modulation devices, such as an electro-optical element having a large number of controllable, reflective diffraction gratings, such as described in connection with FIG. 4 or with an array of acoustic-optical elements.

The light distribution device 325 is specifically adapted for use in connection with a fly's eye integrator 380 and allows illumination of the pupil shaping surface 331 at the entrance of the fly's eye integrator 380 such that individual optical channels of the fly's eye condenser are either substantially completely irradiated or are substantially non-irradiated, whereby a high uniformity of light mixing can be obtained with a minimum of light loss. This effect is obtained by the combined action of the controllable mirror arrangement 320 and the second diffractive optical element 390 arranged downstream thereof between the mirror arrangement and the pupil-shaping surface 331 as follows. The individual light beams 317 reflected by the individual mirrors 321 of the mirror arrangement 320 have specific angles with respect to the optical axis depending on the orientation of the individual mirrors 321. These angles are designated as "offset-angles" in the following. Each offset-angle corresponds to a defined position in the optical far field of the mirror arrangement, i.e. in the pupil-shaping surface 331. The second diffractive optical element 390 is designed as a computer generated hologram (CGH) such that it creates, at each location of the diffractive optical element illuminated by a light beam 317, a defined angular distribution 391 around the light beam 317, wherein this defined angular distribution corresponds, in the pupil shaping surface 331, to the size and shape of a single lens element 383 of the entry side raster arrangement 383 of the fly's eye condenser. In other words: in this embodiment the angular distribution 391 created by the second diffractive optical element 390 corresponds to a rectangular illumination area in the pupil shaping surface 331. In the combined action of the mirror arrangement 320 and the second diffractive optical element, the position of an illuminated area corresponding to a single light beam 317 in the pupil-shaping surface 331 can be controlled by tilting the individual mirrors 321 to the desired offset-angles, and the shape and size of the illuminated areas is essentially formed by the diffractive optical element 390.

Figure 6:
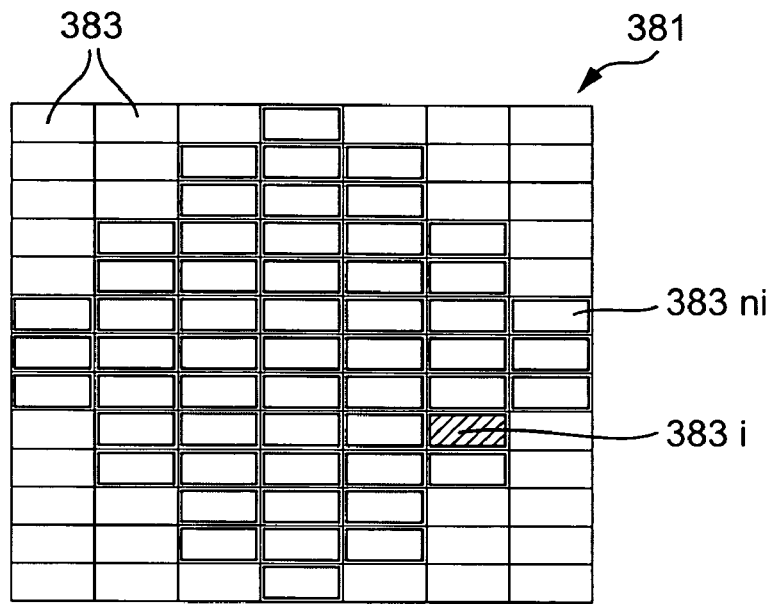
FIG. 6-9 show schematic diagrams of light distributions on an entrance side of a fly's eye condenser in the embodiment according to FIG. 5.
Figure 7:
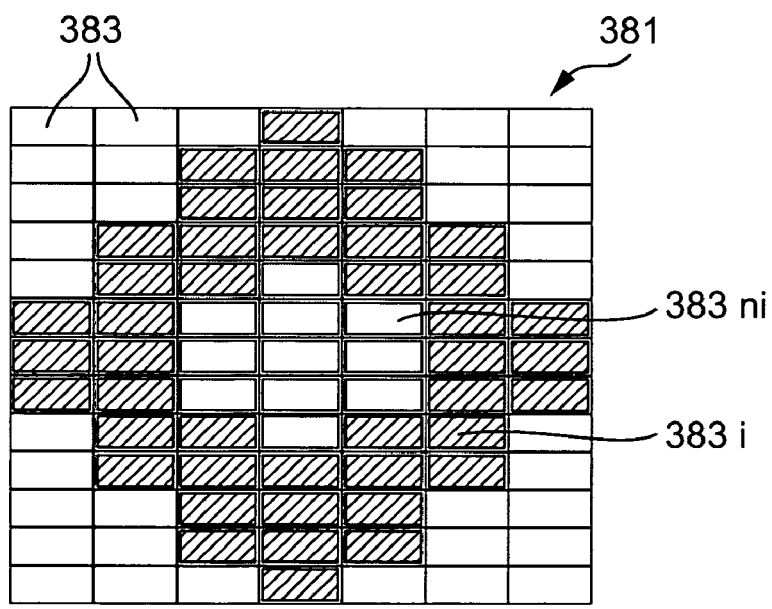
Figure 8:
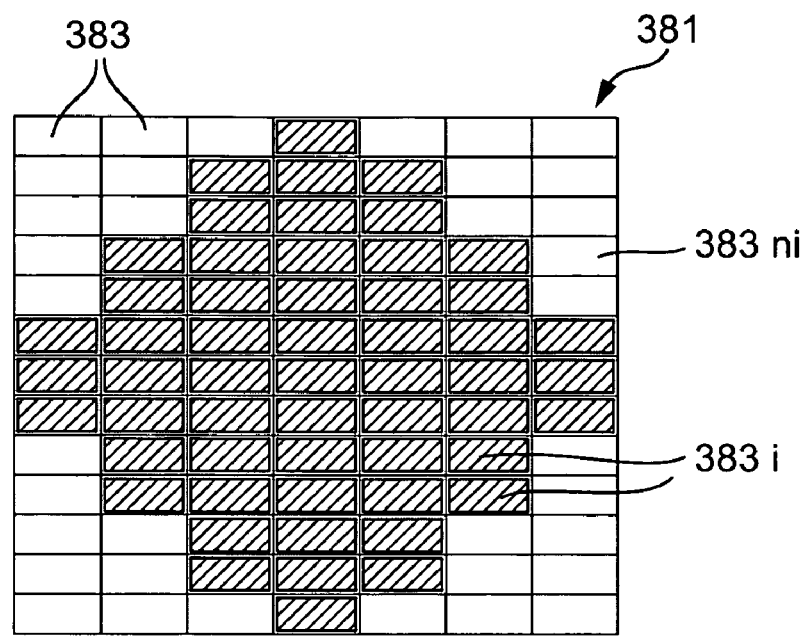

Since the tilting orientation of the individual mirrors can be individually controlled by the control device 322, individual optical channels of the fly's eye condenser 380 can be addressed selectively such that an optical channel is either completely illuminated or completely left out from the illumination. In order to demonstrate this capability FIG. 6 shows schematically a view along the optical axis 312 on the entry side of the fly's eye integrator 380, where the rectangular lenses 383 of the first raster arrangement 381 can be seen. In FIG. 6, one particular optical channel 383i (i.e. one selected field honeycomb 383i) is illuminated (dark area) whereas all other optical channels 383ni are not illuminated. FIG. 7 shows an example where an annular setting is obtained by controlling the tilting angles of the individual mirrors 321 such that an essentially ring-shaped illuminated area (dark areas) is created on the entry surface of the fly's eye condenser. Again, all rectangular cylindrical lenses 383 of the first raster arrangement 381 are either completely illuminated (dark areas 383i) or completely non-illuminated of (bright rectangles 383ni). FIG. 8 shows a corresponding example for a conventional setting where the illuminated area on the entry side of the fly's eye condenser 380 (in the pupil-shaping surface 331) is essentially circular. Again, the macroscopically circular shape of the illuminated area is divided into small rectangles corresponding to single optical channels of the fly's eye condenser, where a number of optical channels 383i centred around the optical axis are completely illuminated whereas optical channels 383ni lying outside the desired area are completely non-illuminated.

Figure 9:
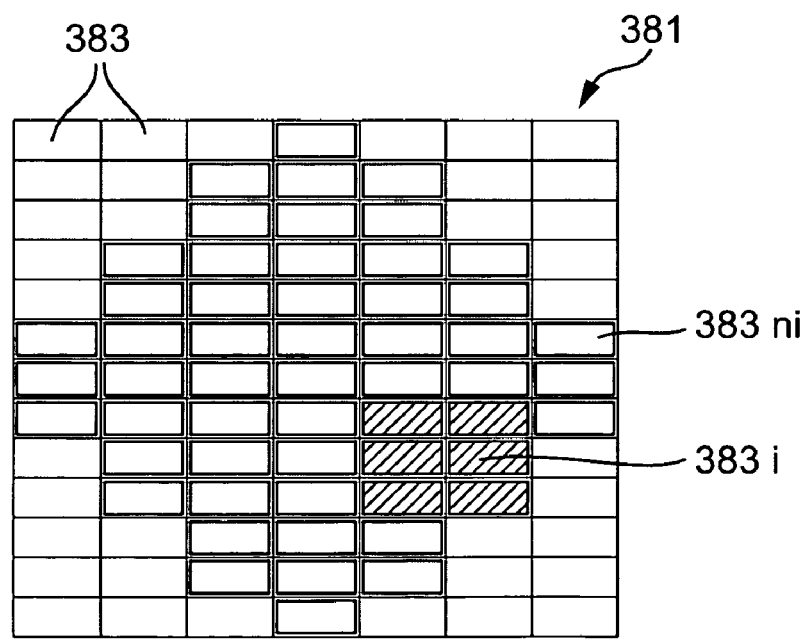

The angular distribution created by the second diffractive optical element 390 is adapted to the shape of the microlenses constituting the field honeycombs 383. This shape, in turn, is a miniature shape of the rectangular shape of the illumination field 351. In illumination systems used for scanner-systems this shape has a high width-to-height aspect ratio to obtain a slit shaped illumination field. A typical aspect ratio between width and height of a rectangular illumination field may be in the range between 2:1 and 8:1, for example. On the other hand, it may be advantageous in some illumination settings (for example conventional settings or annular settings) to obtain a two-dimensional intensity distribution in the pupil-shaping surface 381 which is essentially symmetric around the optical axis. In these cases it may be preferable to use second diffractive optical elements 390 having an effect function that allows the shaping of the exiting light beam 391 such that the illuminated area on the entry side of the fly's eye condenser 380 includes more than one "honeycombs" for each individual light beam 317. FIG. 9 shows an example where a second diffractive optical element 390 is designed such that a light beam originating from one individual mirror 321 is formed such that the light covers a block or group of six adjacent rectangular lenses 383 of the first raster 381i to obtain an almost square shaped illumination area with an aspect ratio close to unity.

Figure 10:
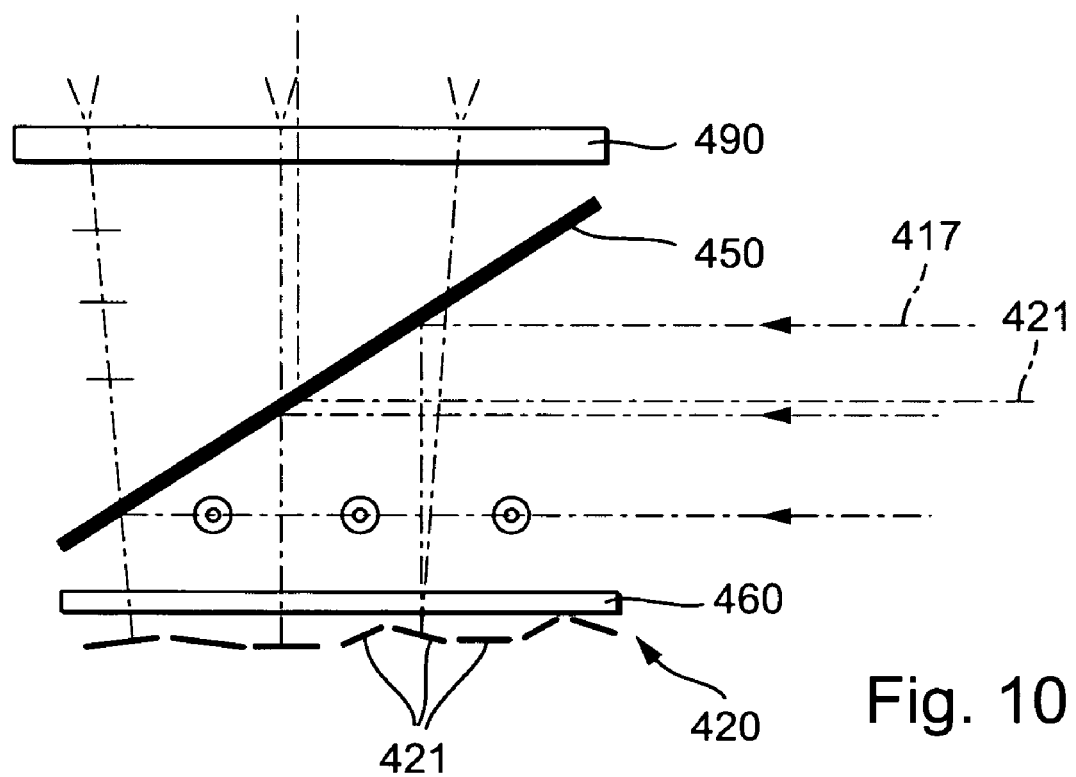
FIG. 10 shows a section of another embodiment of an illumination system including a polarizing beam splitter.

FIG. 10 shows schematically a section of another embodiment of an illumination system including a mirror arrangement 420 serving as an optical modulation device and a second diffractive optical element 490 downstream of the mirror arrangement. The construction upstream and downstream of the section depicted in FIG. 10 may be constructed similarly or identically to the illumination system shown in FIG. 5. This embodiment is adapted for linearly polarized light provided for e.g. by a laser. In contra-distinction to the embodiments shown above, the reflective light modulator 420 comprising the individual mirror elements 421 is arranged generally perpendicular to the optical axis 412. The optical axis is folded at a polarization-selective splitter surface 450 inclined at 45° to the optical axis and arranged geometrically between the mirror arrangement 420 and the second diffractive optical element 490, which is oriented parallel to the mirror arrangement. An optical retardation device formed as a λ/4-plate 460 is arranged immediately ahead of the mirror arrangement 420 between the mirror arrangement and the polarizer 450. The polarizer 450 may be a thin-film polarizer. The polarization beam splitter surface may be arranged on a thin transparent plate or within a block of transparent material.

The incoming laser beam is polarized such that the field vector of the electrical field oscillates perpendicular to the incidence plane on the planar beam splitter surface 450 (s polarization). The polarizing layer structure is designed such that it essentially reflects light with s-polarization and substantially transmits light with p-polarization (where the electrical field vector oscillates parallel to the incident plane). S-polarized beams 417 impinging on the beam splitter 450 are reflected towards the mirror arrangement 420. The linear polarization is transformed to circular polarization upon transiting the quarterwave-plate 460 such that circularly polarized light is reflected by the mirrors 421. The reflected beams having a desired off-set angle with respect to the optical axis transit the quarterwave-plate 460 which transforms circular polarization into p-polarization. The p-polarized beams 417 are then transmitted through the polarizer 450 and are then incident on the second diffractive optical element 490 which introduces an angular spectrum adapted to the size and shape of the optical channels of the fly's eye integrator. In this arrangement all individual laser beams 417 have essentially the same optical path length between the light source and the second diffractive element 490, which is arranged in the vicinity or at a field plane of the illumination system. Therefore, this plane is the same for all beams with respect to the optical imaging occurring in the illumination system. Similar arrangements with polarizing beam splitter may also be used in some or all other embodiments described above.

In the embodiments of FIGS. 5 and 10 the mirror arrangement 320, 420 can be regarded as a first diffuser element of the illumination system, since a particular angular distribution of light is created depending on the construction and setting of the individual mirrors of the mirror arrangement. The second diffractive optical element 390, 490 can be considered as a second diffuser element since a particular angular distribution is created by this element. By arranging the second diffractive optical element downstream of the mirror arrangement, the angular distribution created by the first diffuser element 320, 420 is optically folded with the angular distribution created by the second diffuser element 390, 490 in the optical far field (in the pupil-shaping plane). The first diffuser element 320, 420 is illuminated with an essentially collimated laser beam and is positioned in the vicinity of a field plane of the illumination system which may be the first field plane of the illumination system. The second diffuser element 390, 490 is positioned between this field plane and a pupil plane of the illumination system being Fourier-conjugated to the field plane where the first diffuser is positioned. It is a particular feature that the first diffuser element is a dynamical element where the effect function can be controlled dynamically by the action of a control device.

The invention claimed is:

1. An illumination system for a microlithography projection exposure system for illuminating an illumination field with light from a primary light source, the illumination system comprising:
    a light distribution device which receives light from the primary light source and which produces a two-dimensional intensity distribution in a pupil-shaping surface of the illumination system,
    wherein the light distribution device variably sets the two-dimensional intensity distribution,
    wherein the light distribution device comprises at least one optical modulation device which controllably changes an angular distribution of the light incident on the optical modulation device,
    wherein the optical modulation device comprises an array of individual elements that are driven individually to change an angle of radiation incident on the individual elements,
    wherein, between the light source and the optical modulation device, there is arranged an optical device which concentrates radiation incident on the optical device onto the individual elements of the optical modulation device,
    wherein the optical device forms a plurality of beams from the incident radiation and concentrates each of the plurality of beams onto a respective individual element of the optical modulation device, and
    wherein an axicon system is arranged between the optical modulation device and the pupil-shaping surface.

2. The illumination system according to claim 1, wherein the optical modulation device is controlled such that at least substantially all of the light intensity that is incident on the optical modulation device is deflected into a usable region of the pupil-shaping surface.

3. The illumination system according to claim 1, further comprising, between the optical modulation device and the pupil-shaping surface, an optical system which converts the angular distribution produced by the optical modulation device into a spatial distribution in the pupil-shaping surface.

4. The illumination system according to claim 3, wherein the optical system has a variable focal length.

5. The illumination system according to claim 3, wherein the axicon system is incorporated into the optical system.

6. The illumination system according to claim 1, wherein the optical modulation device is a reflective optical modulation device.

7. The illumination system according to claim 6, wherein the reflective optical modulation device is arranged obliquely with respect to an optical axis in the manner of a deflection mirror.

8. The illumination system according to claim 1, wherein, between the optical modulation device and the pupil-shaping surface, there is an optical distance such that angles between an optical axis and light beams belonging to the angular distribution in the region of the pupil-shaping surface are less than 5°.

9. The illumination system according to claim 1, wherein the individual elements of the optical modulation device comprise an array of individual mirrors in at least one mirror arrangement.

10. The illumination system according to claim 9, wherein at least some of the individual mirrors have a flat mirror surface.

11. The illumination system according to claim 9, wherein at least some of the individual mirrors are curved mirrors with a finite mirror focal length.

12. The illumination system according to claim 11, wherein the mirror focal length is dimensioned such that radiation incident on the individual mirrors strikes the pupil-shaping surface in substantially focused form.

13. The illumination system according to claim 9, wherein the individual mirrors are adaptive mirrors, which are adjustable in shape.

14. The illumination system according to claim 9, wherein the individual mirrors of the mirror arrangement all have the same shape and size.

15. The illumination system according to claim 9, wherein the mirror arrangement comprises a first mirror group and at least a second mirror group, each mirror group comprises at least one individual mirror, and the individual mirrors of the mirror groups have at least one of differing sizes, differing shapes and differing curvatures.

16. The illumination system according to claim 9, wherein at least some of the individual mirrors of the mirror arrangement have an optical structure which forms a distribution of the radiation reflected from the respective individual mirror.

17. The illumination system according to claim 16, wherein the optical structure is a diffractive optical structure.

18. The illumination system according to claim 9, wherein some individual mirrors of the mirror arrangement are tilted relative to other individual mirrors of the mirror arrangement.

19. The illumination system according to claim 1, wherein the optical modulation device is an electro-optical element, and the array of individual elements is selected from the group consisting of controllable diffraction gratings and acousto-optical elements.

20. The illumination system according to claim 1, wherein the optical device comprises a two-dimensional array comprising telescope lens systems.

21. The illumination system according to claim 1, wherein the optical device comprises a diffractive optical array generator which transforms an incoming beam into a plurality of light beams concentrated on individual optical elements of the optical modulation device.

22. The illumination system according to claim 21, wherein the diffractive optical array generator is a Dammann grid.

23. The illumination system according to claim 1, further comprising, between the pupil-shaping surface and a plane of the illumination field, a light mixing device which mixes the light of the intensity distribution.

24. The illumination system according to claim 23, wherein the light mixing device comprises at least one integrator rod having an entry surface, and the pupil-shaping surface lies in the region of a plane which is located upstream of the entry surface and which is a Fourier-transformed plane in relation to the entry surface.

25. The illumination system according to claim 23, wherein the light mixing device comprises at least one fly's eye condenser.

26. The illumination system according to claim 25, wherein the fly's eye condensor has an entry surface, and the pupil-shaping surface lies in the region of the entry surface or a surface which is optically conjugate with respect to the entry surface.

27. The illumination system according to claim 25, further comprising a component which controls the optical modulation device such that individual radiation channels of the fly's eye condenser are either at least substantially irradiated or at least substantially non-irradiated.

28. The illumination system according to claim 25, wherein the light distribution device comprises at least one diffractive optical element arranged optically between the optical modulation device and the pupil-shaping surface, which receives light emerging from the optical modulation device, and which modifies the light by introducing an angular distribution according to an effect function defined by the configuration of the diffractive optical element.

29. The illumination system according to claim 28, wherein a beam which emerges from an individual element of the optical modulation device is shaped by the diffractive optical element to conform to the shape and size of one single optical channel or a group of adjacent optical channels of the fly's eye condenser.

30. The illumination system according to claim 28, wherein the diffractive optical element is a computer generated hologram.

31. The illumination system according to claim 25, wherein the fly's eye condenser is not assigned any mask for the individual blocking of radiation channels.

32. The illumination system according to claim 1, wherein neither a fly's eye condenser nor an integrator rod is arranged between the pupil-shaping surface and a plane of the illumination field.

33. The illumination system according to claim 1, wherein, in or in the vicinity of the pupil-shaping surface, there is arranged a raster element which shapes and homogenizes the intensity distribution in a following field plane of the illumination system.

34. The illumination system according to claim 1, further comprising a control device which drives individual elements of the optical modulation device, such that control signals which control the individual elements are varied as a function of the structure of a mask to be exposed.

35. The illumination system according to claim 1, wherein the optical device comprises a two-dimensional raster arrangement of optical elements or a diffractive optical array generator.

* * * * *